US012674077B2

(12) United States Patent
Hong et al.

(10) Patent No.: US 12,674,077 B2
(45) Date of Patent: Jul. 7, 2026

(54) POLISHING COMPOSITION FOR SEMICONDUCTOR PROCESSING AND METHOD OF POLISHING A SUBSTRATE

(71) Applicant: YCCHEM CO., LTD., Seongju-gun (KR)

(72) Inventors: Seung Chul Hong, Seoul (KR); Kangsik Myung, Seoul (KR); Deok Su Han, Seoul (KR); Han Teo Park, Seoul (KR); Yongsoo Choi, Seoul (KR)

(73) Assignee: YCCHEM CO., LTD., Seongju-gun (KR)

( * ) Notice: Subject to any disclaimer, the term of this patent is extended or adjusted under 35 U.S.C. 154(b) by 203 days.

(21) Appl. No.: 18/403,539

(22) Filed: Jan. 3, 2024

(65) Prior Publication Data

US 2024/0218251 A1 Jul. 4, 2024

(30) Foreign Application Priority Data

Jan. 4, 2023 (KR) ........................ 10-2023-0001144

(51) Int. Cl.

| | |
|---|---|
| ***C09G 1/04*** | (2006.01) |
| ***A01N 43/80*** | (2006.01) |
| ***A01N 59/00*** | (2006.01) |
| ***A01N 59/08*** | (2006.01) |
| ***A01P 1/00*** | (2006.01) |
| ***B24B 37/04*** | (2012.01) |
| ***C09G 1/00*** | (2006.01) |
| ***C09G 1/02*** | (2006.01) |
| ***C09G 1/06*** | (2006.01) |
| ***C09K 3/14*** | (2006.01) |
| ***C09K 13/00*** | (2006.01) |
| ***C09K 13/04*** | (2006.01) |
| ***C09K 13/06*** | (2006.01) |
| ***H10P 52/40*** | (2026.01) |
| ***H10P 95/00*** | (2026.01) |

(52) U.S. Cl.

CPC ............... *C09G 1/04* (2013.01); *A01N 43/80* (2013.01); *A01N 59/00* (2013.01); *A01N 59/08* (2013.01); *A01P 1/00* (2021.08); *B24B 37/044* (2013.01); *C09G 1/00* (2013.01); *C09G 1/02* (2013.01); *C09G 1/06* (2013.01); *C09K 3/1436* (2013.01); *C09K 3/1454* (2013.01); *C09K 3/1463* (2013.01); *C09K 13/00* (2013.01); *C09K 13/04* (2013.01); *C09K 13/06* (2013.01); *H10P 52/402* (2026.01); *H10P 52/403* (2026.01); *H10P 95/062* (2026.01)

(58) Field of Classification Search

None

See application file for complete search history.

(56) References Cited

U.S. PATENT DOCUMENTS

2025/0206985 A1* 6/2025 Kim ......................... C09K 3/14

FOREIGN PATENT DOCUMENTS

| | | | | | |
|---|---|---|---|---|---|
| CN | 101608098 | A | | 12/2009 | |
| CN | 114790367 | A | | 7/2022 | |
| CN | 116000782 | | * | 4/2023 | ............. B24B 29/02 |
| KR | 10-1998-0064179 | A | | 10/1998 | |
| KR | 10-2005-0122754 | A | | 12/2005 | |
| KR | 10-2018-0099570 | A | | 9/2018 | |
| KR | 10-2019-0072116 | A | | 6/2019 | |
| KR | 10-2021-0014185 | A | | 2/2021 | |

OTHER PUBLICATIONS

Horiba, "Understanding and Interpreting Particle Size Distribution Calculations", downloaded on Dec. 8, 2025 from: https://www.horiba.com/usa/scientific/products/particle-characterization/particle-education/understanding-and-interpreting-particle-size-distribution-calculations/ (Year: 2025).*

* cited by examiner

*Primary Examiner* — Jiong-Ping Lu

(74) *Attorney, Agent, or Firm* — NSIP Law

(57) ABSTRACT

A composition for semiconductor processing includes polishing particles, water, and a biocide. The biocide includes a first biocide and a second biocide, the first biocide includes a thiazolinone-based compound, and the second biocide includes a chloric acid-based compound.

15 Claims, No Drawings

POLISHING COMPOSITION FOR SEMICONDUCTOR PROCESSING AND METHOD OF POLISHING A SUBSTRATE

CROSS-REFERENCE TO RELATED APPLICATION

This application claims the benefit under 35 U.S.C. 119(a) of Korean Patent Application No. 10-2023-0001144 filed on Jan. 4, 2023, the entire disclosure of which is incorporated herein by reference for all purposes.

BACKGROUND

1. Field

The following description relates to a polishing composition for semiconductor processing that suppresses polishing performance degradation caused by microbial and/or mold growth and suppresses the occurrence of defects in a polished product, and a method of polishing a substrate on which the polishing composition is applied.

2. Discussion of Related Art

As semiconductor devices become more miniaturized and highly integrated, techniques to form finer patterns are being used, resulting in more complex surface structures and increasing gaps between adjacent films. A chemical mechanical polishing ("CMP") process is used as a planarization technique to remove the gaps in certain films formed on a substrate to manufacture semiconductor devices.

In the CMP process, a substrate is pressurized and rotated while a slurry is fed to a polishing pad to polish its surface. Different stages of the process will require different targets to be planarized, and different slurries may be applied to different targets.

For an effective CMP process, there is also an increasing emphasis on the storage stability of the composition for a semiconductor process applied to the slurry.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a composition for semiconductor processing includes polishing particles, water, and a biocide. The biocide includes a first biocide and a second biocide, the first biocide includes a thiazolinone-based compound, and the second biocide includes a chloric acid-based compound.

The biocide may include less than 0.16 parts by weight based on 100 parts by weight of the polishing particles.

The first biocide and the second biocide may include a weight ratio of 1:0.1 to 1.0.

The first biocide may include 0.01 to 0.15 parts by weight, based on 100 parts by weight of the polishing particles.

The second biocide may include 0.005 to 0.1 parts by weight, based on 100 parts by weight of the polishing particles.

The polishing particles may include colloidal silica.

The colloidal silica may have a diameter ($D_{50}$) of 20 nm to 60 nm.

The colloidal silica may include at least 2 wt % based on a total composition for semiconductor processing.

The composition for semiconductor processing may have a pH of at least 2 and less than 4.5.

When the composition for semiconductor processing is left in an atmosphere of 60° C. for 12 hours, there are no more than 15 particles having a diameter of 5 μm or more per liter of the composition for semiconductor processing.

When the composition for semiconductor processing is left in an atmosphere of 60° C. for 12 hours, there are no more than 150 particles having a diameter of 1 μm per liter of the composition for semiconductor processing.

The composition for semiconductor processing may further include a pad protector.

The pad protector may include a sugar alcohol compound or a disaccharide compound.

In another general aspect, a method of polishing a substrate includes providing a polishing pad-mounted plate and a carrier receiving the substrate; and producing a polished substrate by planarizing a surface of the substrate by a polishing surface of the polishing pad while rotating at least one of the plate and the carrier. The producing of the polished substrate is performed in the presence of a composition for semiconductor processing, and the composition for semiconductor processing is the above-described composition for semiconductor processing.

The surface of the substrate to be polished may include an insulating film and a tungsten film, the polished substrate may be a circular wafer having a diameter of 300 mm, and the polished substrate may have no more than 70 tungsten defects on a surface of the polished substrate.

The surface of the substrate to be polished may include an insulating film and a tungsten film, and a ratio of a polishing rate of the tungsten film to a polishing rate of the insulating film may be 1:11 to 15.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

In the specification, when one part "includes" a component, it means that it may also include other components, rather than excluding components unless particularly stated otherwise.

In the specification, when one component is "connected" to another component, it means that the one component is "directly connected," or "connected with a third component therebetween."

In the specification, "B is disposed on A" means that B is located directly in contact with A, or B is located on A and another layer is located therebetween, and it is not limited to being interpreted as B being located in contact with the surface of A.

In the specification, the term "combination thereof" included in the Markush-type expression refers to a mixture or combination of one or more selected from the group consisting of components described in the Markush-type expression, that is, one or more selected from the group consisting of the components.

In the specification, the description of "A and/or B" means "A, B, or A and B."

In the specification, the terms "first" and "second," or "A" and "B" are used to distinguish the same terms from each other unless otherwise specified.

In the specification, singular expressions are interpreted to include singular or plural forms as interpreted in the context, unless otherwise specified.

In the specification, ppm is based on weight. In the specification, a day is based on approximately 24 hours. Hereinafter, present disclosures will be described in more detail.

Present disclosures are directed to providing a composition for semiconductor processing with improved storage stability and defect suppression property. Present disclosures are also directed to providing a method of polishing a substrate, which improves the storage stability of the composition for semiconductor processing, inhibits the generation of defects, and enables a more efficient polishing process.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

A composition for semiconductor processing according to an example of the present disclosure includes polishing particles, water, and a biocide.

Polishing Particles

Polishing particles or abrasive particles may have primarily a physical etching action and may also have a planarization or leveling action through mechanical friction with the surface of the substrate to be polished.

The polishing particles may include inorganic particles, organic particles, or a combination of organic and inorganic particles.

Inorganic particles include inorganic particles that have been surface modified with organic material. That is, inorganic particles should be understood to include trace amounts of organic components. As used herein, trace amounts refer to amounts of about 0.03 parts by weight or less based on 100 parts by weight of the total polishing particles. The organic-inorganic composite particles contain 50 to 200 parts by weight of organic component based on 100 parts by weight of inorganic component.

In one example, the inorganic particles may include at least one metal oxide particle selected from the group consisting of silica ($SiO_2$), ceria ($CeO_2$), alumina ($Al_2O_3$), zirconia ($ZrO_2$), and a combination thereof.

The polishing particles may be in a colloidal state. In one example, the polishing particles may include colloidal inorganic particles. The polishing particles may include colloidal silica particles.

The polishing particles may be metal oxide particles having a surface with a functional group.

The surface may include a functional group having an epoxy group at the ends.

The surface may include a functional group having an amine group at the ends.

The surface may include a first functional group having an epoxy group at the ends, and/or a second functional group having an amine group at the ends. The ratio of the first functional group to the second functional group may be a molar ratio of 1:1 to 15. The ratio of the first functional group to the second functional group may be a molar ratio of 1:1 to 8. By applying the first functional group and the second functional group in the above ratio, the possibility of defects occurring during polishing may be reduced, and the storage stability of the polishing composition may be improved.

A silane compound having the first functional group may be an epoxy silane.

In one example, the epoxy silane is any one selected from the group consisting of 3-glycidoxypropyltrimethoxysilane, 3-glycidoxypropyltriethoxysilane, 3-(2,3-epoxypropoxypropyl)methyldimethoxysilane, 2-(3,4-epoxycyclohexyl) ethyltrimethoxysilane, and a combination thereof.

In an example, a silane compound having the second functional group may be an amino silane, an ureido silane, and a combination thereof. The silane compound having the second functional group may be amino silane. In another example, the amino silane may be any one selected from the group consisting of 3-aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyl dimethoxysilane, N-[3-(trimethoxysilyl)propyl]ethylenediamine, N-bis[3-(trimethoxy silyl)propyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethyl aminopropyltriethoxysilane, dimethylaminopropyltrimethoxysilane, N-[3-(trimethoxysilyl)propyl] butylamine, and a combination thereof. The ureido silane may be any one selected from the group consisting of 3-ureidotrimethoxysilane, 3-ureidotriethoxysilane, and a combination thereof.

The silane compound may be applied in an amount of 1 part to 10 parts by weight, based on 100 parts by weight of the metal oxide particles. The silane compound may be applied in an amount of from 3 parts to 8 parts by weight, based on 100 parts by weight of the metal oxide particles. In this case, the surface of the metal oxide particle may be sufficiently modified. Also, in this case, a film layer may not be formed on the metal oxide particles, so that the polishing speed of the polishing particles may be maintained at a desired level.

The content of the silane compound may be the sum of the content of a silane compound having a first functional group and the content of a silane compound having a second functional group.

The diameter ($D_{50}$) of the polishing particles may be 10 nm to 120 nm. The diameter ($D_{50}$) of the polishing particles may be 15 nm to 90 nm. The diameter ($D_{50}$) of the polishing particles may be 20 nm to 60 nm. When the diameter ($D_{50}$) of the polishing particles exceeds 120 nm, the likelihood of defects such as scratches on a substrate to be polished may increase. When the diameter ($D_{50}$) of the polishing particles is less than 10 nm, the dispersity of the particles may be degraded or the occurrence of defects may increase. When the diameter ($D_{50}$) of the polishing particles is from 20 nm to 60 nm, excellent physical properties may be obtained when the particles are applied to a composition for semiconductor processing on a substrate having a fine interconnection width.

The diameter mentioned above is measured using nano-ZS equipment (Malvern) that measures the size of a particle by dynamic light scattering (DLS).

The polishing particles may be particles having a zeta potential of +1 mV to +80 mV, +15 mV to +60 mV, or +17 mV to +40 mV. When the inorganic particles or organic particles themselves do not have a zeta potential in the above range, particles treated to have the above zeta potential through surface modification may be applied.

A method of measuring the zeta potential of the polishing particles is not particularly limited, and for example, may be measured after inputting approximately 1 mL of the polishing particles to a cell for measurement using a zeta potential measuring device (Zeta-sizer Nano ZS, Malvern).

The polishing particles may have a zeta potential in the above range by modifying the surface of a colloidal silica particle with an amino silane and/or epoxy silane.

The polishing particles may comprise more than 1 wt %, or more than 2 wt %, based on the total composition of the semiconductor process. The polishing particles may comprise more than 2.5 wt % based on the total composition for a semiconductor process. The polishing particles may comprise 30 wt % or less, 20 wt % or less, 10 wt % or less, or 6 wt % or less, based on the total weight of the composition for the semiconductor process.

When a composition for a semiconductor process includes polishing particles in the above range, a more efficient polishing process can be performed.

When the surface of the substrate to be polished contains both tungsten and an insulating film (such as a silicon oxide film), it is preferable to apply surface-modified colloidal silica particles as polishing particles.

Biocide

In an example, biocide that inhibits the growth of bacteria and/or molds may be applied. However, a biocide should be applied within the range that does not limit the physical properties or polishing properties of the composition for a semiconductor process.

In an example of the present disclosure, two or more types of biocides are applied to the composition for a semiconductor process.

A first biocide may include a thiazolinone-based compound.

A second biocide may include a chloric acid-based compound.

The thiazolinone-based compound may include thiazolinone or a derivative thereof.

The thiazolinone-based compound may include one selected from the group consisting of methylisothiazolinone (MIT), chloromethylisothiazolinone (CMIT), benzisothiazolinone (BIT), octylisothiazolinone (OIT), dichlorooctylisothiazolinone (DCOIT), butylbenzisothiazolinone (BBIT), and a combination thereof. In an example, the thiazolinone-based compound may include benzisothiazolinone. In this case, compared with methylisothiazolinone and chloromethylisothiazolinone, benzisothiazolinone has the advantage of having excellent sterilization ability while having limited irritation and corrosion.

When applied at relatively high concentrations, thiazolinone-based compounds can inhibit the growth of fungi, such as bacteria and molds. In addition, even when the thiazolinone-based compound is not applied at relatively high concentrations, it may inhibit the growth of germs such as bacteria.

The thiazolinone-based compound may have low solubility in an aqueous solution. A thiazolinone-based solution containing approximately 2 wt % or more or 3 wt % or more of the thiazolinone-based compound may be prepared using an alcohol-based solvent such as ethanol, and then a solid content may be removed by filtering and applied to the composition for a semiconductor process of the embodiment.

The chloric acid-based compound includes hypochlorite ($OCl^-$) or a derivative thereof. Here, a derivative of hypochlorite means a material that can generate hypochlorite in an aqueous solution.

The chloric acid-based compound may include any one selected from the group consisting of t-butyl hypochlorite ($(CH_3)_3COCl$), sodium hypochlorite ($NaOCl$), calcium hypochlorite ($Ca(OCl)_2$), lithium hypochlorite ($LiOCl$), barium hypochlorite ($Ba(ClO)_2$), and a combination thereof. For example, the chloric acid-based compound may include sodium hypochlorite.

The chloric acid-based compound may inhibit the growth of germs such as bacteria, in an aqueous solution. In addition, the chloric acid-based compound may be applied at low concentrations to achieve bacterial inhibition, and their small molecular size makes them suitable for application in compositions for semiconductor processing.

In the present disclosure, since both the first biocide and the second biocide described above are used for the biocide, even when used at a low concentration, an excellent growth inhibitory effect on both bacteria and fungi may be obtained.

The sterilization mechanism of biocides is known. The functional groups of biocides bind to amino acids on the surface of microbial cells to destroy the cell membrane of the microbe or to inhibit the growth of the microbe. For example, thiol groups on the surface of a fungal cell may undergo a direct binding reaction with the functional group of a biocide. In addition, thiol groups on the surface of a fungal cell may have a competitive reaction with an active site of a protein. In bacteria, the functional groups of the biocide may react with the plasma membrane or a cell wall material to induce cell death or destruction. For example, the functional groups of a biocide may react with an amino group of fungal cells or the capsid of viral genetic material to destroy cells or inhibit cell growth.

Rather than using one type of biocide, applying compounds having two different functional groups as above as a biocide may destroy various types of microbes or inhibit microbial growth by different mechanisms, improving biocidal efficiency.

In addition, such a biocide may improve the stability of the composition for a semiconductor process. The biocide has a functional group with high reactivity. The biocide not only acts selectively on microbes, but can also interact with other materials included in the composition for a semiconductor process.

When the biocide is applied at a high concentration, a sufficient biocidal effect may be achieved, but unintended reactions with other materials in the composition may occur, serving as a new type of defect.

Even when two or more biocides with high biocidal efficiency are applied at low concentrations, the composition for a semiconductor process of the present disclosure may achieve sufficient microbial growth inhibitory effect and/or sufficient microbial removal effect, and may reduce the possibility of unintended defects occurring.

The composition for a semiconductor process of the present disclosure may also improve usability.

The composition for a semiconductor process can be applied to a polishing process by itself after storing the polishing particles in a dispersed state, rather than applying the composition prepared separately into high-concentration particle dispersions and other solutions, and mixing them immediately before use. This can bring beneficial effects such as an increase in efficiency of the polishing process.

The composition for a semiconductor process of the present disclosure may include the biocide, and the biocide may include less than 0.16 parts by weight based on 100 parts by weight of the polishing particles. The composition for a semiconductor process may include the biocide in an amount of not more than 0.14 parts by weight or less, or not more than 0.12 parts by weight, based on 100 parts by weight of the polishing particles. The composition for a semiconductor process may include at least 0.035 parts by weight or at least 0.04 parts by weight of biocide, based on 100 parts by weight of the polishing particles.

By applying the above two types of biocides in the above content range, a fairly good microbial growth inhibition effect may be obtained even with a relatively low content of biocides, and the effect of improving the storage stability of the composition for a semiconductor process may also be obtained.

The composition for a semiconductor process may include the first biocide and the second biocide in a weight ratio of 1:0.1 to 1.0, or 1:0.1 to 0.8. When the first and second biocides are applied in the above content ratio, a more efficient microbial growth inhibition effect may be achieved.

The composition for a semiconductor process of the present disclosure may include 0.01 to 0.15 weight parts of the first biocide, based on 100 weight parts of the polishing particles. The composition for a semiconductor process may include 0.02 to 1.3 parts by weight, or 0.02 to 1.2 parts by weight of the first biocide, based on 100 parts by weight of the polishing particles. By applying the first biocide in the above range, the deterioration of the properties of a polished product may be inhibited while achieving the bactericidal and fungicidal effects of the first biocide.

The composition for a semiconductor process of the present disclosure may include a second biocide at a level of 0.005 to 0.1 parts by weight, based on 100 parts by weight of the polishing particles. The composition for a semiconductor process may include the second biocide at a level of 0.008 to 0.08 parts by weight or 0.01 to 0.06 parts by weight, based on 100 parts by weight of the polishing particles. By applying the second biocide in the above range, the bactericidal effect of the second biocide may be achieved, and together with the first biocide, an excellent bacterial and fungal inhibitory effect may also be achieved.

Other Additives

The composition for a semiconductor process may further include a pad protector.

As a pad protector, a sugar alcohol compound having three or more alcohol groups may be applied. In an example, the sugar alcohol compound may be any one selected from the group consisting of maltitol, lactitol, threitol, erythritol, ribitol, xylitol, arabitol, adonitol, sorbitol, talitol, mannitol, iditol, allodulcitol, dulcitol, galactitol, sedoheptitol, perseitol, and a combination thereof. In particular, sorbitol may be applied as a sugar alcohol compound, and sorbitol may also be referred to as glucitol.

As a pad protector, a disaccharide compound may be applied. In one example, sucrose, lactulose, maltose, trehalose, cellobiose, or chitobiose may be applied as a pad protector.

The composition for a semiconductor process may include the pad protector in a range of 10 parts by weight to 200 parts by weight, 30 parts by weight to 150 parts by weight, and 50 parts by weight to 90 parts by weight, based on 100 parts by weight of the polishing particles. When the pad protector is included in the above range, surface damage to the polishing pad applied in the polishing process may be substantially inhibited as the pad protector coats the pad surface by combining moisture on the pad surface with the pad protector.

The composition for a semiconductor process of the present disclosure may further include a polymer compound having a halogen group as an additive.

The polymer compound having a halogen group may include a repeating unit of Formula 1.

[Fromula 1]

$$-\!\!\left[ CR_1R_2 - CR_3R_4 - O \right]\!\!-$$

In Formula 1, the repeating unit may be repeated 1 time to 10 times, $R_1$ to $R_4$ are the same or different, and may each be independently selected from the group consisting of hydrogen, a halogen group, a hydroxyl group, an alkyl group having 1 to 10 carbon atoms, a cycloalkyl group having 3 to 10 carbon atoms, an alkenyl group having 2 to 10 carbon atoms, and an alkynyl group having 2 to 10 carbon atoms. Any one or more of $R_1$ to $R_4$ is a halogen group.

The halogen group may include a fluorine group (—F). That is, the compound having the repeating unit of Formula 1 may be a fluorine-based compound. The repeating unit may be repeated 3 to 8 times.

As the polymer compound having a halogen group, BNO—BS—BOH (BNOChem), FS-30, FS-31, FS-34, ET-3015, ET-3150, and ET-3050 and Capstone FS-3100 (Chemours) may be applied alone or in combination.

When the composition for a semiconductor process includes the polymer compound having a halogen group, excessive adsorption of the polishing particles to a surface to be polished may be effectively prevented. In addition, the surface to be planarized, such as a silicon oxide film, may be changed or maintained in a state favorable for polishing.

The composition for a semiconductor process according to an example of the present disclosure may include a polymer compound having 0.0001 parts by weight to 1 part by weight, or 0.0003 parts by weight to 0.8 parts by weight, of a halogen group based on 100 parts by weight of the polishing particles. By including a polymer compound having a halogen group in the above range, an effect of reducing defects caused by excessive adsorption of polishing particles can be obtained.

The composition for a semiconductor process according to an example of the present disclosure may further include an organic acid.

The organic acid may mainly serve as a complexing agent that controls the polishing properties of metals such as copper or traps metal ions such as copper ions.

In an example, the organic acid may include one selected from the group consisting of acetic acid, formic acid, benzoic acid, nicotinic acid, picolinic acid, alanine, phenylalanine, valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylenediamine tetraacetic acid (EDTA), nitrilotriacetic acid (NTA), iminodiacetic acid (IDA), and a combination thereof.

The composition for a semiconductor process according to an example of the present disclosure may include citric acid as the organic acid.

The composition for a semiconductor process may include from 0.01 parts by weight to 3 parts by weight of organic acid, based on 100 parts by weight of the polishing particles. The composition for a semiconductor process may include 0.05 parts by weight to 2 parts by weight, 0.1 parts by weight to 1 part by weight, and 0.12 parts by weight to 0.8 parts by weight, based on 100 parts by weight of the polishing particles. When organic acids are included in the above content ranges, the planarization effect may be much improved on surfaces where conductive films comprising metals such as copper are placed side by side and simultaneously have films of other materials.

The composition for a semiconductor process of the present disclosure may further include a non-ionic polymer.

The non-ionic polymer may be at least any one selected from the group consisting of polyethylene glycol, polypropylene glycol, polyvinylpyrrolidone, polyethylene oxide, polypropylene oxide, polyalkyloxides, polyoxyethylene oxide, a polyethylene oxide-propylene oxide copolymer, cellulose, methylcellulose, methylhydroxyethylcellulose, methylhydroxypropylcellulose, hydroxyethylcellulose, carboxymethylcellulose, carbxoymethylhydroxyethylcellulose, sulfoethylcellulose, and carboxymethylsulfoethylcellulose.

The non-ionic polymer may have a weight average molecular weight of less than 25,000 g/mol. When the weight average molecular weight of the non-ionic polymer is less than 25,000 g/mol, the non-ionic polymer may have excellent solubility and excellent dispersibility. The non-ionic polymer may have a weight average molecular weight of 1,000 g/mol or more and less than 25,000 g/mol. When the non-ionic polymer having a weight average molecular weight in the above range is applied, the composition for a semiconductor process may have more excellent solubility and dispersion stability, and it is also advantageous in terms of polishing properties.

The non-ionic polymer may be included from 0.01 wt % to 5 wt % based on the total composition of the semiconductor process. The non-ionic polymer may be included from 0.1 wt % to 2 wt % based on the total polishing composition for a semiconductor process. In this case, the occurrence of defects on the polished substrate surface may be reduced, and reattachment of particles to the polished substrate surface after polishing may be effectively suppressed.

The composition for a semiconductor process of the present disclosure may include a phosphoric acid-based compound. The phosphoric acid-based compound may control the polishing properties for a barrier film such as a silicon nitride film.

The phosphoric acid-based compound may be one selected from the group consisting of, for example, phosphomolybdic acid, nitrilotris(methylenephosphonic acid), phosphorus trichloride, and a combination thereof. In the present disclosure, the phosphoric acid-based compound may include nitrilotris(methylenephosphonic acid).

The composition for a semiconductor process may include a phosphoric acid-based compound in a content of from 0.01 to 1.0 parts by weight, from 0.02 to 0.7 parts by weight, from 0.05 to 0.5 parts by weight, and from 0.07 to about 0.3 parts by weight, based on 100 parts by weight of the polishing particles. When the phosphoric acid-based compound is applied in the composition for a semiconductor process at the above content, the polishing properties for a barrier film such as a silicon nitride film may be properly ensured, and a planarization process may be carried out more smoothly by promoting an appropriate polishing balance with other films.

The composition for a semiconductor process according to an example of the present disclosure may further include an acid component, in addition to the above components, for the solution to be prepared and maintained in an appropriate pH range. The acid component may be applied to the polishing composition for a semiconductor process along with a pH adjuster.

As the acid component, one or more of hydrochloric acid (HCl), phosphoric acid ($H_3PO_4$), sulfuric acid ($H_2SO_4$), and nitric acid ($HNO_3$) may be applied. As the pH adjuster, one or two or more of ammonium hydroxide ($NH_4OH$), potassium hydroxide (KOH), and sodium hydroxide (NaOH) may be applied.

The acid component and the pH adjuster may be applied at appropriate amounts according to a desired pH.

The composition for a semiconductor process according to one aspect of the present disclosure may be an aqueous dispersion. An aqueous dispersion means that pure water is used as the primary solvent, and includes some liquid organic materials or some organic solvent.

Composition for a Semiconductor Process

A composition for a semiconductor process according to an example of the present disclosure may be an acidic solution. Specifically, the pH of the composition for a semiconductor process may be 2 to 4.5. The pH of the composition for a semiconductor process may be 2 to 4. By maintaining the acidic environment in the above range, excessive corrosion of the metal parts or the polishing device may be prevented and the polishing speed and polishing quality may be maintained at or above a certain level. However, the composition for a semiconductor process having acidic properties may suffer from performance degradation and reduced dispersion stability due to the growth of fungi or bacteria. The composition for a semiconductor process of the present disclosure minimizes changes in polishing performance, secure dispersion stability, and suppresses performance degradation due to growth of bacterial by applying the biocide described above.

The composition for a semiconductor process of the present disclosure may have no more than 15, no more than 14, or no more than 13 particles with a diameter of 5 μm or more per liter when left in a 60° C. atmosphere for 12 hours. The composition for a semiconductor process may have 0 or more, or 5 or more, particles with a diameter of 5 μm or more per liter when left in a 60° C. atmosphere for 12 hours. Here, particles with a diameter of 5 μm or more include secondary particles of a size that can be generated by agglomeration during storage. The diameter and number of particles described above were measured using AccuSizer equipment (PSSA).

The composition for a semiconductor process of the present disclosure may have no more than 150 particles, no more than 140 particles, and no more than 135 particles with a diameter of 1 μm or greater per liter when left in a 60° C. atmosphere for 12 hours. The composition for a semiconductor process may have 0 or more, 80 or more, and 100 or more particles with a diameter of 1 μm or greater per liter when left in a 60° C. atmosphere for 12 hours. Here, the particles having a diameter of 1 μm or greater include secondary particles of a size that can be generated by agglomeration during storage. The diameters and numbers of particles described above were measured using AccuSizer equipment (PSSA).

In general, the chemical mechanical polishing (or chemical mechanical planarization; CMP) process is not only applied to the planarization of dielectrics such as silicon oxide ($SiO_2$) films or silicon nitride (SiN) films, but is also indispensable for the planarization process of metal interconnection such as tungsten (W) or copper (Cu).

CMP for tungsten barrier metal layer is a CMP process in which three types of films are simultaneously exposed, including silicon oxide ($SiO_2$) film, and titanium/titanium nitride film used as a barrier metal film, and tungsten (W) film. In order to properly polish these three types of films with desired selectivity, as well as to secure performance that reduces the defect rate, a high level of technical skill is required.

The composition for a semiconductor process of the present disclosure may have a tungsten film polishing rate to a silicon oxide film polishing rate in a ratio of 1:11 to 15, 1:11.5 to 14, and 1:11.7 to 13.8. When the ratio of polishing rates for both film materials is in the above range, the composition for a semiconductor process is suitable for an application process of a film with tungsten.

The composition for a semiconductor process of the present disclosure may have a tungsten polishing rate of 100 Å/min or more, or 120 Å/min or more. The tungsten polishing rate may be 200 Å/min or less, or 160 Å/min or less.

The composition for a semiconductor process of the present disclosure may have a silicon oxide film polishing rate of 1500 Å/min or more, or 1650 Å/min or more. The silicon oxide film polishing rate may be 2000 Å/min or less, and 1900 Å/min or less.

A composition for a semiconductor process that can have the above-described polishing rates for tungsten and silicon oxide films may stably polish a surface including tungsten at a relatively high speed.

The polishing rate for tungsten is expressed by converting the results obtained by applying a slurry flow rate of 300 mL/min, a carrier speed of 63 rpm, a platen speed of 57 rpm, and a down pressure of 2.2 psi for 15 seconds to a value calculated by applying a polishing time of 1 minute. Also, the polishing rate of silicon oxide film is based on the polishing performed for 60 seconds at a slurry flow rate of 300 mL/min, carrier speed of 103 rpm, platen speed of 75 rpm, and down pressure of 2.2 psi. Here, the polishing equipment was an AP-300 model (CTS) and the polishing pad was an HD-500 (SKC solmics).

When the composition for a semiconductor process of the present disclosure is applied, 70 or less, 50 or less, or 40 or less of tungsten defects may be detected on the polished substrate. Tungsten defects are based on those measured by a method disclosed in the following examples. Briefly describing the method, after polishing and cleaning using a round wafer with a diameter of 300 mm, the total number of defects measured using AIT-XP+ equipment is treated as the number of defects.

The composition for a semiconductor process of the present disclosure exhibits excellent polishing properties and good dispersion stability over relatively long periods of time when applied to surfaces containing a tungsten film and a silicon oxide film, as well as surfaces where both tungsten films, tungsten barrier metal films, and silicon oxide films are exposed.

Method of Polishing Substrate

A method of polishing a substrate according to an example of the present disclosure includes a preparation step, and a polishing step.

The preparation step is a step of providing a polishing pad-mounted plate and a carrier accommodating a substrate. Common plates and carriers applied to polishing equipment can be applied, and any polishing pad applied in polishing of an target substrate can be applied.

The polishing step is a step of producing a polished substrate by planarizing the surface of the substrate by a polishing surface of the polishing pad while rotating at least one of the plate and the carrier. The polishing is performed in the presence of the composition for a semiconductor process.

As the composition for a semiconductor process, the above-described composition is applied.

The surface of the substrate to be polished may include an insulating film and a tungsten film.

The polished substrate may have no more than 70, or no more than 50 tungsten defects, based on one surface of a circular wafer with a diameter of 300 mm. The polished substrate may have 0 or more, or 20 or more tungsten defects.

The polished substrate surface may include an insulating film and a tungsten film, and a ratio of the tungsten film polishing rate to the insulating film polishing rate may be 1:11 to 15, 1:11.5 to 14, and 1:11.7 to 13.8. When the polished substrate surface has a ratio of the polishing rates for the two film materials in the above ranges, the method of polishing the substrate may efficiently polish the film comprising tungsten.

In the method of polishing a substrate, a tungsten polishing rate may be 100 Å/min or more, or 120 Å/min or more. The tungsten polishing rate may be 200 Å/min or less, or 160 Å/min or less.

In the method of polishing a substrate, a silicon oxide film polishing rate may be 1500 Å/min or more, or 1650 Å/min or more. The silicon oxide film polishing rate may be 2000 Å/min or less, or 1900 Å/min or less.

According to the method of polishing a substrate that can have the polishing rates described above for tungsten and silicon oxide films, polishing may be reliably performed at a relatively high speed on a surface containing tungsten.

The polishing rate for tungsten is expressed by converting the result obtained by applying a slurry flow rate of 300 mL/min, a carrier speed of 63 rpm, a platen speed of 57 rpm, and a down pressure of 2.2 psi for 15 seconds to a calculated value with 1 minute polishing time applied. In addition, the polishing rate for the silicon oxide film is based on polishing performed at a slurry flow rate of 300 mL/min, a carrier speed of 103 rpm, a platen speed of 75 rpm, and a down pressure of 2.2 psi for 60 seconds. Here, polishing equipment is an AP-300 model (CTS), and a polishing pad is HD-500 (SKC solmics).

Hereinafter, the present disclosure will be described in more detail with reference to specific examples. The following examples are merely provided to help understand the present disclosure, and the scope of the present disclosure is not limited thereto.

1. Preparation of Polishing Composition

Surface-modified polishing particles were prepared by applying colloidal silica particles having a $D_{50}$ of approximately 45 nm as metal oxide particles such that the total content of 3-aminopropyl triethoxy silane as an amine-based silane and a pH adjuster became 1 part by weight to 2 parts by weight based on 200 parts by weight of the silica particles.

The surface-modified polishing particles and the composition in Table 1 below were applied, and pure water was applied as the remainder so that the total content was 100 parts by weight.

TABLE 1

| | Parts by weight (Converted parts by weight*) | | | | | |
|---|---|---|---|---|---|---|
| | Polishing particles | Pad protector* | First biocide* | Second biocide* | Sum based on polishing particles 100* | Biocide ratio |
| Example 1 | 3 | 2 (66.67) | 0.001 (0.0333) | 0.0005 (0.0167) | 0.0500 | 0.5 |
| Example 2 | 3 | 2 (66.67) | 0.002 (0.0667) | 0.0005 (0.0167) | 0.0833 | 0.25 |
| Example 3 | 3 | 2 (66.67) | 0.003 (0.1000) | 0.0005 (0.0167) | 0.1167 | 0.1667 |
| Comparative Example 1 | 3 | 2 (66.67) | 0 (0) | 0 (0) | 0.0000 | — |
| Comparative Example 2 | 3 | 2 (66.67) | 0.005 (0.1667) | 0 (0) | 0.1667 | — |
| Comparative Example 3 | 3 | 2 (66.67) | 0 (0) | 0.001 (0.0333) | 0.0333 | — |
| Comparative Example 4 | 3 | 2 (66.67) | 0 (0) | 0.01 (0.3333) | 0.3333 | — |

A number in ( ) indicates a content based on 100 parts by weight of polishing particles.

Sorbitol is applied as a pad protector.

Benzisothiazolinone (BIT) is applied as a first biocide, and NaOCl is applied as a second biocide.

*The sum based on polishing particles 100 means the sum of the contents of the first biocide and the second biocide, converted based on 100 parts by weight of the polishing particles.

The biocide ratio represents the content ratio (weight ratio) of the second biocide when the content of the first biocide is considered to be 1.

2. Evaluation of Physical Properties of Composition for a Semiconductor Process (1) Microbe Analysis To confirm whether or not microbes are contained, sterilized potato dextrose agar (PDA) and trypticase soy agar (TSA) were prepared, 1 g each of test germs including bacteria such as *E. coli*, and *S. aureus*, and fungi such as *C. albicans, A. pullulans*, and *A. niger* was inoculated, and then the cells were incubated at 20° C. for 14 hours, followed by confirming whether microbes were formed in the sample by checking colony formation.

For an antimicrobial activity test, a strain grown in the same basal medium as above was added to the sample and incubated at 20° C., followed by measuring colony unit values on day 0, day 7, and day 14.

When the number of colonies increases, it is considered to be "poor" with no sterilization ability, when the number of colonies is maintained, it is considered to be "good" with preservation ability, and when the number of colonies decreases, it is considered to be "excellent" with good sterilization ability.

(2) Evaluation of Dispersion Stability

1 L each of the samples of Examples and Comparative Examples was prepared as an individual sample, and then the samples were stored at 60° C. using a convection oven. When stored at 60° C. for one hour, deterioration performance similar to that of one-month room temperature storage can be expected.

The samples were stored at the above temperature for up to 12 hours, and then taken every hour to count the number of large particles (diameter of 1 μm or more, or 5 μm or more), thereby evaluating dispersion stability. The measurement equipment was AccuSizer equipment (PSSA).

(3) Evaluation of Polishing Performance

Polishing evaluation was performed using a tungsten wafer that has a diameter of approximately 300 mm and a thickness of approximately 650 Å, and a silicon oxide film wafer that has a thickness of approximately 20,000 Å.

For tungsten wafers, polishing was performed for 15 seconds under a pressure of 2.2 psi at a carrier speed of 63 rpm, a platen speed of 57 rpm, and a slurry flow rate of 300 mL/mi, and for the silicon oxide film wafer, polishing was performed for 60 seconds under a pressure of 2.2 psi at a carrier speed of 103 rpm, a platen speed of 57 rpm, and a slurry flow rate of 300 mL/min.

The polishing equipment was an AP-300 model (CTS), and after equipping HD-500 (SKC Solmics) as a polishing pad, polishing was performed in a conventional manner.

The thickness of each wafer was measured after the polishing process, and from this the polishing rates (polishing speed; Å/min) for the tungsten film and the silicon oxide film of the corresponding slurry composition were calculated.

(4) Defect Measurement

After performing the polishing under the same conditions as the Evaluation of polishing performance, a cleaning process was performed under conditions of spraying a cleaning solution for 60 seconds, a brushing rotation speed of 500 rpm and a flow rate of 2000 cc/min, using electronic-grade ammonia water (SIC) and a hydrofluoric acid dilution product. After sealing the cleaned tungsten and silicon oxide film wafers in a wafer FOUP, the total number of defects was measured using AIT-XP+ equipment (owned by SKC).

TABLE 2

| | Anti-bacterial activity | Anti-mold activity | Dispersion stability (time@60° C.) | Dispersion stability Number of particles with diameter of 1.0 μm or more | Dispersion stability Number of particles with diameter of 5.0 μm or more |
|---|---|---|---|---|---|
| Example 1 | Excellent | Excellent | 12 | 120 | 8 |
| Example 2 | Excellent | Excellent | 12 | 133 | 12 |
| Example 3 | Excellent | Excellent | 12 | 123 | 6 |
| Comparative Example 1 | Ineffective | Ineffective | 3 | 134 | 11 |
| Comparative Example 2 | Excellent | Excellent | 12 | 142 | 16 |
| Comparative Example 3 | Excellent | Ineffective | 3 | 142 | 21 |
| Comparative Example 4 | Ineffective | Good | 3 | 132 | 18 |

| | Tungsten polishing rate (Å/15 sec) | Converted tungsten polishing rate (Å/min) | Silicon oxide film polishing rate (Å/min) | Ratio of polishing rates* | Number of defects |
|---|---|---|---|---|---|
| Example 1 | 34 | 136 | 1835 | 13.49 | 32 |
| Example 2 | 37 | 148 | 1762 | 11.91 | 39 |
| Example 3 | 36 | 144 | 1714 | 11.90 | 47 |
| Comparative Example 1 | 35 | 140 | 1842 | 13.16 | 31 |
| Comparative Example 2 | 34 | 136 | 1563 | 11.49 | 124 |
| Comparative Example 3 | 39 | 156 | 1821 | 11.67 | 36 |
| Comparative Example 4 | 72 | 288 | 1793 | 6.23 | 41 |

Referring to Tables 1 and 2, it was found that Examples 1 to 3 exhibited excellent anti-bacterial and anti-mold activities. However, Comparative Example 1 with no biocide added was found to be ineffective in inhibiting bacteria and mold, and Comparative 2 with excessive amount of the first biocide was found to have excellent antimicrobial effect but increased the degree of tungsten defect generation. It was confirmed that Comparative Example 3, which had only the second biocide, showed substantially difficult fungal inhibition, and decreased storage stability. It was confirmed that Comparative Example 4, which had an excessive amount of the second biocide, did not inhibit fungi, showed insufficient dispersion stability and a significantly increased tungsten polishing rate.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A composition for semiconductor processing, the composition comprising:

polishing particles, water, and a biocide, wherein the polishing particles comprise colloidal silica particles having a surface modified with an epoxy silane and an amino silane, wherein the biocide comprises a first biocide and a second biocide, wherein the first biocide comprises benzisothiazolinone (BIT), and wherein the second biocide comprises sodium hypochlorite.

2. The composition of claim 1, wherein the biocide comprises less than 0.16 parts by weight based on 100 parts by weight of the polishing particles.

3. The composition of claim 1, wherein the first biocide and the second biocide comprise a weight ratio of 1:0.1 to 1.0.

4. The composition of claim 1, wherein the first biocide comprises 0.01 to 0.15 parts by weight, based on 100 parts by weight of the polishing particles.

5. The composition of claim 1, wherein the second biocide comprises 0.005 to 0.1 parts by weight, based on 100 parts by weight of the polishing particles.

6. The composition of claim 1, wherein the colloidal silica has a diameter ($D_{50}$) of 20 nm to 60 nm, and wherein the colloidal silica comprises at least 2 wt % based on a total composition for semiconductor processing.

7. The composition of claim 6, wherein the composition for semiconductor processing has a pH of at least 2 and less than 4.5.

8. The composition of claim 7, wherein when the composition for semiconductor processing is left in an atmosphere of 60° C. for 12 hours, there are no more than 15 particles having a diameter of 5 μm or more per liter of the composition for semiconductor processing.

9. The composition of claim 7, wherein when the composition for semiconductor processing is left in an atmosphere of 60° C. for 12 hours, there are no more than 150 particles having a diameter of 1 μm per liter of the composition for semiconductor processing.

10. The composition of claim 1, wherein the composition for semiconductor processing further comprises a pad protector, and wherein the pad protector comprises a sugar alcohol compound or a disaccharide compound.

11. The composition of claim 1, wherein the first biocide comprises 0.01 to 0.15 parts by weight, and the second biocide comprises 0.005 to 0.1 parts by weight, based on 100 parts by weight of the polishing particles, and wherein the first biocide and the second biocide comprise a weight ratio of 1:0.1 to 1.0.

12. The composition of claim 1, wherein the first biocide comprises 0.01 to 0.15 parts by weight, and the second biocide comprises 0.005 to 0.1 parts by weight, based on 100 parts by weight of the polishing particles, wherein the first biocide and the second biocide comprise a weight ratio of 1:0.1 to 1.0, wherein the composition further comprises a pad protector which comprises a sugar alcohol compound or a disaccharide compound, and the composition for a semiconductor process comprises the pad protector in a range of 10 parts by weight to 200 parts by weight based on 100 parts by weight of the polishing particles.

13. A method of polishing a substrate, the method comprising:

providing a polishing pad-mounted plate and a carrier receiving the substrate; and producing a polished substrate by planarizing a surface of the substrate by a polishing surface of the polishing pad while rotating at least one of the plate and the carrier, wherein the producing of the polished substrate is performed in the presence of a composition for semiconductor processing, and wherein the composition for semiconductor processing is the composition of claim 1.

14. The method of claim 13, wherein the surface of the substrate to be polished comprises an insulating film and a tungsten film, wherein the polished substrate is a circular wafer having a diameter of 300 mm, and wherein the polished substrate has no more than 70 tungsten defects on a surface of the polished substrate.

15. The method of claim 13, wherein the surface of the substrate to be polished comprises an insulating film and a tungsten film, and wherein a ratio of a polishing rate of the tungsten film to a polishing rate of the insulating film is 1:11 to 15.

* * * * *